(12) United States Patent
Lee et al.

(10) Patent No.: US 12,013,419 B2
(45) Date of Patent: Jun. 18, 2024

(54) INTEGRATED CURRENT SENSOR WITH MAGNETIC FLUX CONCENTRATORS

(71) Applicant: TEXAS INSTRUMENTS INCORPORATED, Dallas, TX (US)

(72) Inventors: Dok Won Lee, Mountain View, CA (US); Jo Bito, Dallas, TX (US); Keith Ryan Green, Prosper, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/871,873

(22) Filed: Jul. 22, 2022

(65) Prior Publication Data

US 2022/0357369 A1 Nov. 10, 2022

Related U.S. Application Data

(63) Continuation of application No. 16/932,299, filed on Jul. 17, 2020, now Pat. No. 11,422,167.

(51) Int. Cl.
| | | |
|---|---|---|
| *G01R 15/20* | (2006.01) | |
| *H01L 23/495* | (2006.01) | |
| *H10N 52/00* | (2023.01) | |
| *H10N 52/80* | (2023.01) | |
| *H10B 61/00* | (2023.01) | |
| *H10N 59/00* | (2023.01) | |

(52) U.S. Cl.
CPC ......... *G01R 15/207* (2013.01); *G01R 15/202* (2013.01); *H01L 23/49586* (2013.01); *H10N 52/00* (2023.02); *H10N 52/80* (2023.02); *H10B 61/00* (2023.02); *H10N 59/00* (2023.02)

(58) Field of Classification Search
CPC ................ G01R 15/207; G01R 15/202; H01L 23/49586; H01N 52/00; H01N 52/80
See application file for complete search history.

(56) References Cited

U.S. PATENT DOCUMENTS

| | | | |
|---|---|---|---|
| 5,942,895 A | 8/1999 | Popovic | |
| 7,358,724 B2 | 4/2008 | Taylor et al. | |
| 9,647,144 B2* | 5/2017 | Heberle | ................... H01L 29/82 |
| 9,810,721 B2* | 11/2017 | Racz | ..................... G01R 15/207 |
| 2007/0080676 A1 | 4/2007 | Racz | |
| 2010/0072992 A1 | 3/2010 | Bauer | |
| 2010/0188078 A1 | 7/2010 | Foletto et al. | |

(Continued)

FOREIGN PATENT DOCUMENTS

EP 3185019 B1 9/2019

OTHER PUBLICATIONS

Allegro Microsystems. High Accuracy, Galvanically Isolated Current Sensor IC with Small Footprint SOIC8 Package. ACS722-DS, Rev. 5. Sep. 3, 2019, pp. 1-23.

(Continued)

*Primary Examiner* — Dominic E Hawkins
(74) *Attorney, Agent, or Firm* — Frank D. Cimino

(57) ABSTRACT

In one example, circuitry is formed in a semiconductor die. A magnetic concentrator is formed on a surface of the semiconductor die and over the circuitry. An isolation spacer is placed on a lead frame. The semiconductor die is placed on the isolation spacer, and the magnetic concentrator is aligned to overlap the lead frame. Electrical interconnects are formed between the semiconductor die and the lead frame.

20 Claims, 4 Drawing Sheets

(56) References Cited

U.S. PATENT DOCUMENTS

| | | |
|---|---|---|
| 2013/0015839 A1* | 1/2013 | Franke ................. G01R 15/202 |
| | | 324/117 H |
| 2016/0282388 A1 | 9/2016 | Milano et al. |
| 2017/0184636 A1 | 6/2017 | Racz et al. |
| 2018/0074137 A1* | 3/2018 | Taylor ................... H10N 52/01 |
| 2020/0041310 A1 | 2/2020 | Lassalle-Balier et al. |
| 2020/0191835 A1 | 6/2020 | Bilbao De Mendizabal |

OTHER PUBLICATIONS

Melexis. "MLX91208 IMC-Hall® Current Sensor (Triaxis® Technology)." Jun. 2018, pp. 1-20.
Extended European Search report for T92142EP01, mailed Dec. 18, 2023, 10 pages.

\* cited by examiner

INTEGRATED CURRENT SENSOR WITH MAGNETIC FLUX CONCENTRATORS

CROSS-REFERENCE TO RELATED APPLICATIONS

This application is a continuation of U.S. patent application Ser. No. 16/932,299 filed Jul. 17, 2020, the entirety of which is incorporated herein by reference.

BACKGROUND

Contactless current sensing is employed in a variety of applications for safely measuring current flow, particularly for high current levels. Open-loop current sensing provides a cost-effective solution in which a magnetic field generated by the flow of current through an electrical conductor is concentrated inside a magnetic core, and a magnetic sensor measures the field and provides an output signal used for estimating the current flow. Open-loop approaches typically consume little power, and can use low sensitivity sensors for measuring high currents.

SUMMARY

In a current sensor that provides high voltage isolation and immunity from stray magnetic fields, a packaged current sensor includes a lead frame, an integrated circuit, an isolation spacer, a first magnetic concentrator, and a second magnetic concentrator. The lead frame includes a conductor. The isolation spacer is between the lead frame and the integrated circuit. The first magnetic concentrator is aligned with the conductor. The second magnetic concentrator is aligned with the conductor.

In another example, a current sensor includes a lead frame, an integrated circuit, an isolation spacer, a first magnetic concentrator, and a second magnetic concentrator. The lead frame includes a conductor. The conductor includes a current input segment, and a current output segment. The integrated circuit includes a Hall effect sensor. The isolation spacer is between the lead frame and the integrated circuit. The first magnetic concentrator is aligned with the current input segment and overlaps the Hall effect sensor. The second magnetic concentrator is aligned with the current output segment.

In a further example, a current sensor includes a lead frame, a first magnetic concentrator, a second magnetic concentrator, an integrated circuit, and an isolation spacer. The lead frame includes a conductor. The conductor includes a current input segment, and a current output segment. The integrated circuit includes a first Hall effect sensor, a second Hall effect sensor, a third Hall effect sensor, and a fourth Hall effect sensor. The isolation spacer is between the lead frame and the integrated circuit. The first magnetic concentrator is formed as a metal layer on the integrated circuit, and overlaps the current input segment, the first Hall effect sensor, and the second Hall effect sensor. The second magnetic concentrator is formed as a metal layer on the integrated circuit, and overlaps the current output segment, the third Hall effect sensor, and the fourth Hall effect sensor.

DETAILED DESCRIPTION

The shortcomings of packaged current sensing circuits include limited voltage isolation between an integrated circuit (including a Hall effect sensor and/or other circuitry) and a current carrying conductor, and susceptibility to errors caused by a stray magnetic field. The current sensors described herein include high-voltage isolation that protects the integrated circuit. Some implementations of the current sensors also include an arrangement of magnetic concentrators and Hall effect sensors that provide immunity from errors due to stray magnetic fields.

Figure 1:
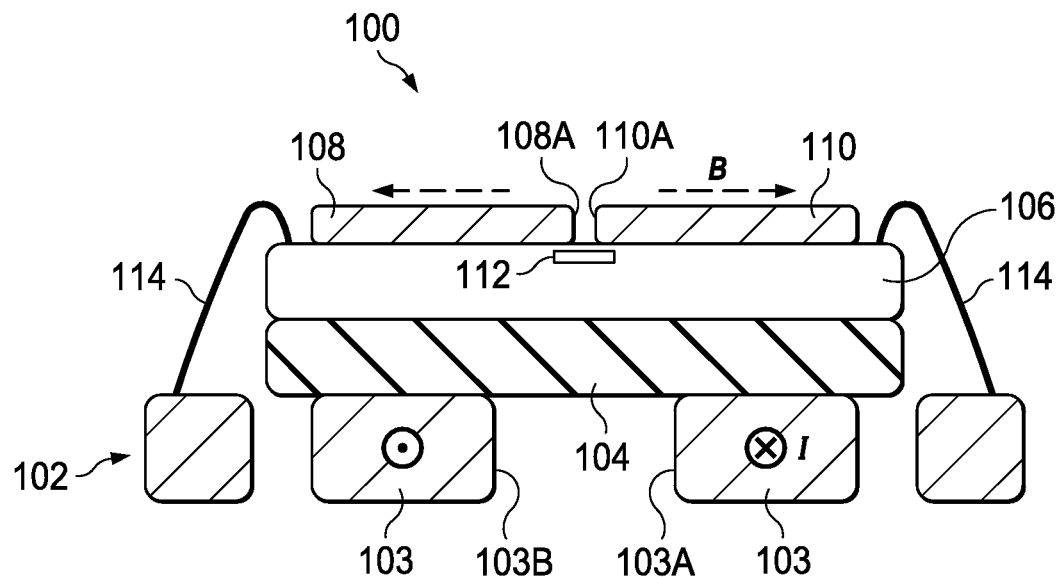
FIG. 1 shows a side view of a current sensor that includes a Hall effect sensor overlapping two magnetic concentrators.

FIG. 1 shows a side view of a current sensor 100 in accordance with this description. The current sensor 100 includes a lead frame 102, an isolation spacer 104, an integrated circuit 106, a magnetic concentrator 108, and a magnetic concentrator 110. The lead frame 102 includes a conductor 103 that carries a current to be measured. The conductor 103 includes a current input leg/segment 103A through which current flows in to the current sensor 100 and a current output leg/segment 103B through which current flows out of the current sensor 100. The isolation spacer 104 is disposed between the lead frame 102 and the integrated circuit 106 to isolate the integrated circuit 106 from high voltages that may be present on the conductor 103. The isolation spacer 104 is formed of material having high dielectric strength, such as glass dielectric materials, polymer-based dielectric materials, or silicon-based dielectric materials. In some implementations of the current sensor 100, the isolation spacer 104 has a thickness of about 100-150 micrometers (um).

The integrated circuit 106 is a silicon die that includes a Hall effect sensor 112 formed thereon. The Hall effect sensor 112 is a horizontal Hall effect sensor. The integrated circuit 106 is disposed between the isolation spacer 104 and the magnetic concentrator 108 and magnetic concentrator 110. In some implementations, the integrated circuit 106 has a thickness of about 150-250 um. The integrated circuit 106 is coupled to the lead frame 102 by bond wires 114 for transfer of electrical signals between the lead frame 102 and the integrated circuit 106.

The magnetic concentrator 108 is aligned with and overlaps the current output leg/segment 103B to concentrate magnetic flux produced by current flow in the current output leg/segment 103B. Similarly, the magnetic concentrator 110 is aligned with and overlaps the current input leg/segment 103A to concentrate magnetic flux produced by current flow in the current input leg/segment 103A. The magnetic flux about the magnetic concentrator 108 and the magnetic concentrator 110 is proportional to the current flowing in the current input leg/segment 103A and the current output leg/segment 103B. In some implementations of the 100, the magnetic concentrators 108 and 110 are formed/deposited on the integrated circuit 106 by electroplating as part of wafer-level processing. Thus, the alignment of the magnetic concentrators 108 and 110 and the Hall effect sensor 112 is precisely controlled. The magnetic concentrators 108 and 110 may be formed of soft magnetic material such as iron-nickel alloy.

The Hall effect sensor 112 is disposed between the magnetic concentrator 108 and the magnetic concentrator 110 and overlaps a portion of both the magnetic concentrator 108 and magnetic concentrator 110. For example, the Hall effect sensor 112 overlaps an edge 108A of the magnetic concentrator 108 and an edge 110A of the magnetic concentrator 110. The Hall effect sensor 112 detects the magnetic flux about the magnetic concentrator 108 and the magnetic concentrator 110, and based on the detected magnetic flux generates an output voltage proportional to the current flowing in the current input leg/segment 103A and the current output leg/segment 103B.

Figure 2:
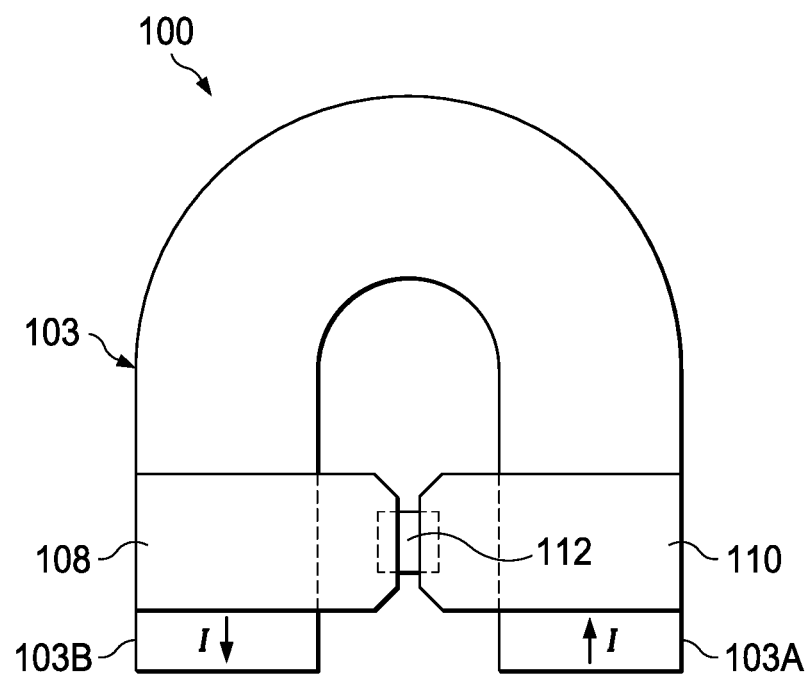
FIG. 2 shows a top view of a current sensor that includes a Hall effect sensor overlapping two magnetic concentrators.

FIG. 2 shows a top view of the current sensor 100. The conductor 103, the magnetic concentrator 108, the magnetic concentrator 110, and the Hall effect sensor 112 are shown in FIG. 2. As shown in FIG. 2, the conductor 103 is "U-shaped" or "horse-shoe-shaped." In various implementations of the current sensor 100, the conductor 103 may have any shape. The magnetic concentrator 108 overlaps the current output leg/segment 103B and the Hall effect sensor 112, and the magnetic concentrator 110 overlaps the current input leg/segment 103A and the Hall effect sensor 112.

Figure 3:
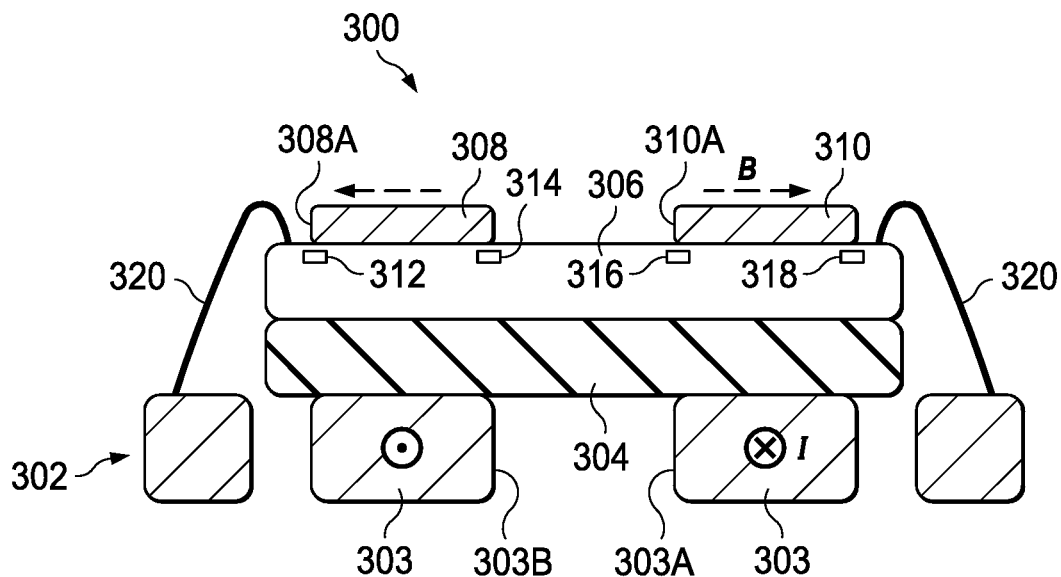
FIG. 3 shows a side view of a current sensor that includes four Hall effect sensors overlapping two magnetic concentrators.

FIG. 3 shows a side view of a current sensor 300 in accordance with this description. The current sensor 300 includes a lead frame 302, an isolation spacer 304, an integrated circuit 306, a magnetic concentrator 308, and a magnetic concentrator 310. The lead frame 302 includes a conductor 303 that carries a current to be measured. The conductor 303 includes a current input leg/segment 303A through which current flows in to the current sensor 300 and a current output leg/segment 303B through which current flows out of the current sensor 300. The isolation spacer 304 is disposed between the lead frame 302 and the integrated circuit 306 to isolate the integrated circuit 306 from high voltages that may be present on the conductor 303. The isolation spacer 304 is formed of material having high dielectric strength, such as glass dielectric materials, polymer-based dielectric materials, or silicon-based dielectric materials. In some implementations, the isolation spacer 304 has a thickness of about 100-150 micrometers (um).

The integrated circuit 306 is a silicon die that includes, formed thereon, a Hall effect sensor 312, a Hall effect sensor 314, a Hall effect sensor 316, and a Hall effect sensor 318. The Hall effect sensor 312, the Hall effect sensor 314, the Hall effect sensor 316, and the Hall effect sensor 318 are horizontal Hall effect sensors. The integrated circuit 306 is disposed between the isolation spacer 304 and the magnetic concentrator 308 and magnetic concentrator 310. In some implementations, the integrated circuit 306 has a thickness of about 150-250 um. The integrated circuit 306 is coupled to the lead frame 302 by bond wires 320 for transfer of electrical signals between the lead frame 302 and the integrated circuit 306.

The magnetic concentrator 308 is aligned with and overlaps the current output leg/segment 303B to concentrate magnetic flux produced by current flow in the current output leg/segment 303B. Similarly, the magnetic concentrator 310 is aligned with and overlaps the current input leg/segment 303A to concentrate magnetic flux produced by current flow in the current input leg/segment 303A. The magnetic flux about the magnetic concentrator 308 and the magnetic concentrator 310 is proportional to the current flowing in the current input leg/segment 303A and the current output leg/segment 303B. The magnetic concentrator 308 and the magnetic concentrator 310 may be provided in the form of a circular magnetic disk, an octagonal magnetic disk, an elliptical magnetic disk, a polygonal magnetic disk, etc. of soft magnetic material such as iron-nickel alloy. In some implementations of the 300, the magnetic concentrators 308 and 310 are formed/deposited on the integrated circuit 306 by electroplating as part of wafer-level processing. Thus, the alignment of the magnetic concentrators 308 and 310 and the Hall effect sensors 312-318 is precisely controlled.

The Hall effect sensor 312 is disposed to overlap an edge 308A of the magnetic concentrator 308. The Hall effect sensor 314 is disposed to overlap the edge of the magnetic concentrator 308 opposite the Hall effect sensor 312. The Hall effect sensor 312 and the Hall effect sensor 314 detect the magnetic flux about the magnetic concentrator 308, and based on the detected magnetic flux generate output voltages proportional to the current flowing in the current output leg/segment 303B.

The Hall effect sensor 316 is disposed to overlap an edge 310A of the magnetic concentrator 310. The Hall effect sensor 318 is disposed to overlap the edge of the magnetic concentrator 310 opposite the Hall effect sensor 316. The Hall effect sensor 316 and the Hall effect sensor 318 detect the magnetic flux about the magnetic concentrator 310, and based on the detected magnetic flux generate output voltages proportional to the current flowing in the current input leg/segment 303A.

Figure 4:
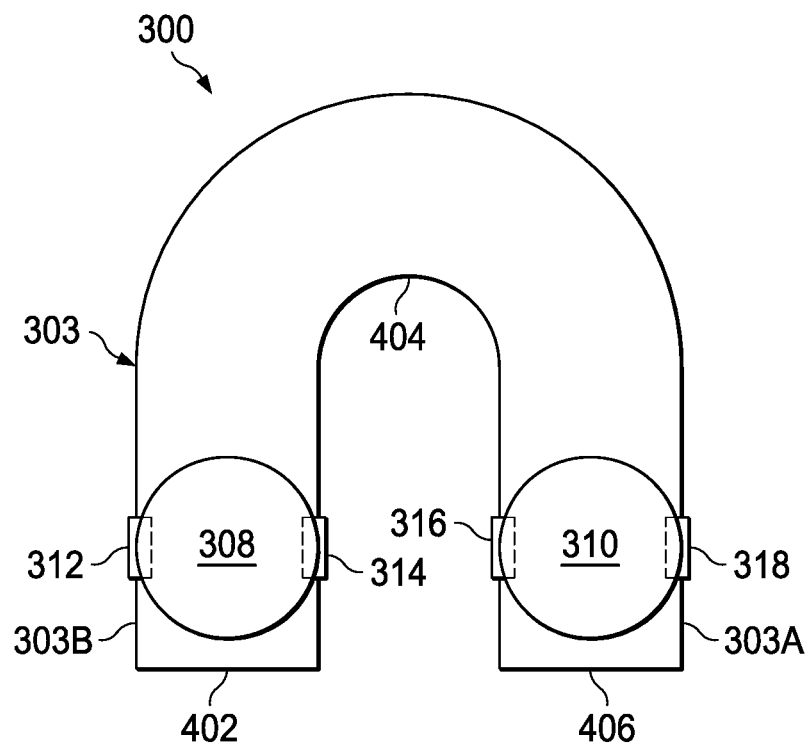
FIG. 4 shows a top view of a current sensor that includes four Hall effect sensors overlapping two magnetic concentrators.

FIG. 4 shows a top view of the current sensor 300. The conductor 303, the magnetic concentrator 308, the magnetic concentrator 310, the Hall effect sensor 312, the Hall effect sensor 314, the Hall effect sensor 316, and the Hall effect sensor 318 are shown in FIG. 4. As shown in FIG. 4, the conductor 303 is "U-shaped." The magnetic concentrator 308 overlaps the current output leg/segment 303B, the Hall effect sensor 312, and the Hall effect sensor 314. The magnetic concentrator 310 overlaps the current input leg/segment 303A, the Hall effect sensor 316, and the Hall effect sensor 318.

The magnetic concentrator 308 is disposed to overlap a linear section of the current output leg/segment 303B. For example, the magnetic concentrator 308 is closer to an end 402 of the current output leg/segment 303B than to an apex 404 of the conductor 303. The magnetic concentrator 310 is disposed to overlay a linear section of the current input leg/segment 303A. For example, the magnetic concentrator 310 is closer to an end 406 of the current input leg/segment 303A than to the apex 404 of the conductor 303. The positioning of the magnetic concentrator 308 and the magnetic concentrator 310 aids in cancellation of error due to stray magnetic fields.

Figure 5:
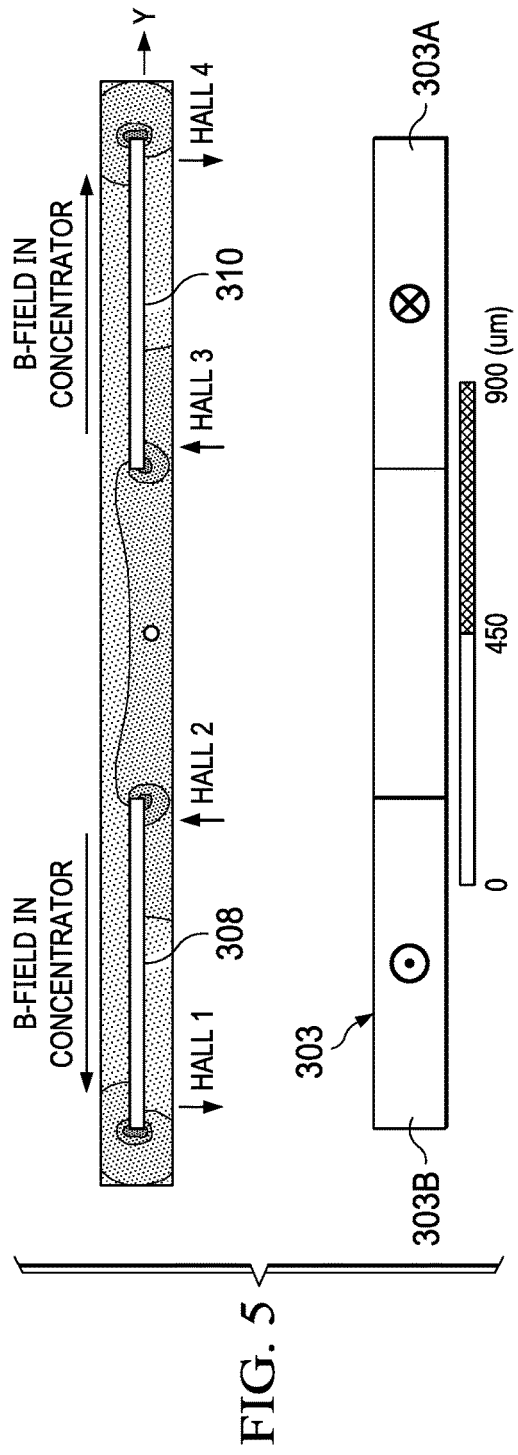
FIG. 5 shows magnetic fields in the magnetic concentrators of FIG. 3 with no stray magnetic field.

FIG. 5 shows magnetic fields in the magnetic concentrators 308 and 310 with no stray magnetic field present. Given the magnetic fields, summation circuitry provided on the integrated circuit 306 sums the output of the Hall effect sensors 312-318 as:

$$V_{out} = -V_{Hall1} + V_{Hall2} + V_{Hall3} - V_{Hall4}$$

where:
$V_{out}$ is the output of the summation circuitry and is proportional to the current flowing in the current input leg/segment 303A and the current output leg/segment 303B;
$V_{Hall1}$ is the output of the Hall effect sensor 312;
$V_{Hall2}$ is the output of the Hall effect sensor 314;
$V_{Hall3}$ is the output of the Hall effect sensor 316; and $V_{Hall4}$ is the output of the Hall effect sensor 318.

Figure 6:
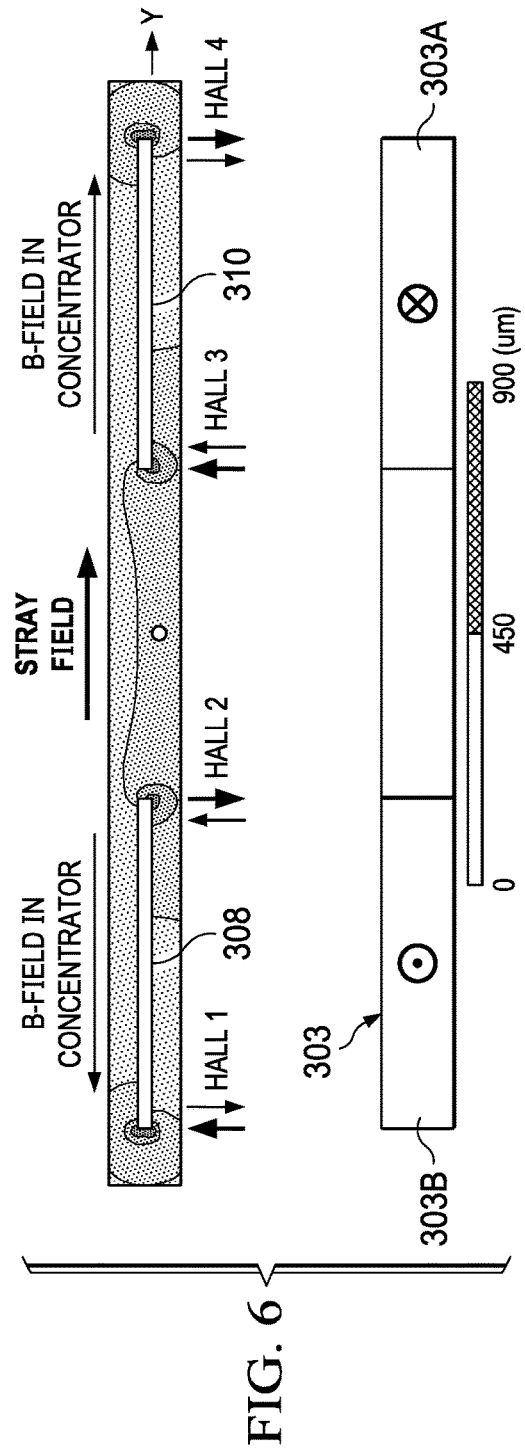
FIG. 6 shows magnetic fields in the magnetic concentrators of FIG. 3 with a stray magnetic field.

FIG. 6 shows magnetic fields in the magnetic concentrators 308 and 310 with a stray magnetic field present.

$$V_{out} = -(V_{Hall1}+V_{stray})+(V_{Hall2}-V_{stray})+(V_{Hall3}+V_{stray})-(V_{Hall4}-V_{stray})$$

where $V_{stray}$ is the voltage induced in the Hall effect sensors 312-318 by the stray magnetic field.

The current flowing in the conductor 303 generates an opposing in-plane magnetic field about the magnetic concentrator 308 and the magnetic concentrator 310. The Hall effect sensors 312-318 measure the opposing magnetic fields to produce output voltages. Summation of the outputs of the Hall effect sensors 312-318 cancels the voltage due to the stray magnetic field. Thus, implementations of the current sensor 300 are not subject to current measurement errors caused by stray magnetic fields.

Figure 7:
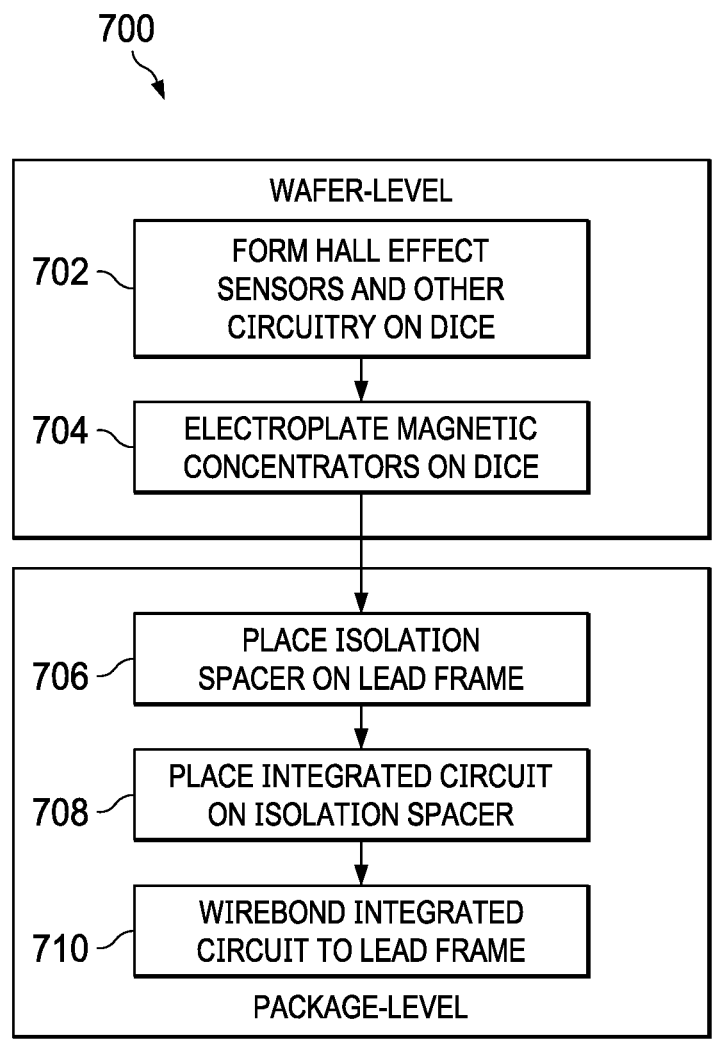
FIG. 7 shows a flow diagram for a method for fabricating a current sensor in accordance with this description.

FIG. 7 shows a flow diagram for a method 700 for fabricating a current sensor in accordance with this description. Though depicted sequentially as a matter of convenience, at least some of the actions shown can be performed in a different order and/or performed in parallel. Also, some implementations may perform only some of the actions shown. In the method 700, the operations of blocks 702 and 704 are performed during wafer-level processing, and the operations of blocks 706-710 are performed during package-level processing.

In block 702, the electrical circuitry is formed on the integrated circuit 306. Accordingly, circuitry is formed on dies of a wafer, where the dies correspond to instances of the integrated circuit 106. The electrical circuitry formed on the dies includes the Hall effect sensors 312-318 and summation circuitry that processes the outputs of the Hall effect sensors 312-318.

In block 704, the magnetic concentrators 308 and 310 are formed on the integrated circuit 106. Accordingly, an instance of the magnetic concentrators 308 and 310 is formed on each instance of the integrated circuit 106 provided on the wafer. The magnetic concentrators 308 and 310 are electroplated on a surface of each die as one or more layers of magnetic material. Because the location of the magnetic concentrators 308 and 310 is established via masking at the wafer-level, the alignment of the magnetic concentrators 308 and 310 with the Hall effect sensors 312-318 can be precisely controlled to improve communication of magnetic fields between the magnetic concentrators 308 and 310 and the Hall effect sensors 312-318.

After singulation, the integrated circuit 106 is packaged in blocks 706-710. In block 706, the isolation spacer 304 is placed on the lead frame 302. For example, the isolation spacer 304 may be bonded to the lead frame 302 using epoxy or other adhesive. In some implementations of the method 700, the isolation spacer 304 is bonded to the wafer before, rather than after, singulation.

In block 708, the integrated circuit 306 is placed on the isolation spacer 304. For example, the integrated circuit 306 may be bonded to the isolation spacer 304 using epoxy or other adhesive.

In block 710, the bond wires 320 are added to electrically couple the integrated circuit 306 to the lead frame 302. An encapsulation compound may be applied to protect the lead frame 302 (or a portion thereof), the isolation spacer 304, and the integrated circuit 306.

In this description, the term "couple" may cover connections, communications, or signal paths that enable a functional relationship consistent with this description. For example, if device A generates a signal to control device B to perform an action, then: in a first example, device A is coupled to device B; or in a second example, device A is coupled to device B through intervening component C if intervening component C does not substantially alter the functional relationship between device A and device B, such that device B is controlled by device A via the control signal generated by device A.

Modifications are possible in the described embodiments, and other embodiments are possible, within the scope of the claims.

What is claimed is:

1. A method comprising:
   forming circuitry in a semiconductor die;
   forming a magnetic concentrator on a surface of the semiconductor die and over the circuitry;
   placing an isolation spacer on a lead frame;
   placing the semiconductor die on the isolation spacer, including aligning the magnetic concentrator to overlap the lead frame; and
   forming electrical interconnects between the semiconductor die and the lead frame.

2. The method of claim 1, wherein forming the magnetic concentrator includes: forming the magnetic concentrator on the surface of the semiconductor die before singulation.

3. The method of claim 2, wherein the circuitry includes a Hall effect sensor, and the method further comprises:
   establishing a location of the magnetic concentrator via masking the semiconductor die; and
   forming the magnetic concentrator at the established location.

4. The method of claim 3, wherein establishing the location of the magnetic concentrator includes: aligning between the magnetic concentrator and the Hall effect sensor.

5. The method of claim 3, wherein:
   the magnetic concentrator is a first magnetic concentrator; and
   the method comprises:
      forming a second magnetic concentrator on the surface of the semiconductor die; and
      aligning the first and second magnetic concentrators to overlap a space therebetween with the Hall effect sensor.

6. The method of claim 3, wherein:
   the Hall effect sensor is a first Hall effect sensor;
   the circuitry includes a second Hall effect sensor;
   the magnetic concentrator has opposite first and second edges; and
   the method comprises:
      aligning the first edge of the magnetic concentrator to overlap the first Hall effect sensor; and
      aligning the second edge of the magnetic concentrator to overlap the second Hall effect sensor.

7. The method of claim 6, wherein:
   the circuitry includes third and fourth Hall effect sensors;
   the magnetic concentrator is a first magnetic concentrator;
   the method comprises:
      forming a second magnetic concentrator on the surface of the semiconductor die, the second magnetic concentrator having opposite third and fourth edges; and
      aligning the second magnetic concentrator to overlap the third and fourth edges of the second magnetic concentrator to the respective third and fourth Hall effect sensors.

8. The method of claim 7, wherein:
   the lead frame includes a conductor having a current input leg and a current output leg; and the method comprises:
aligning the first magnetic concentrator to overlap the current input leg; and
aligning the second magnetic concentrator to overlap the current output leg.

9. The method of claim 8, wherein the conductor has a bent segment electrically coupled between the current input and output segments.

10. The method of claim 8, wherein the conductor has a U shape.

11. The method of claim 7, wherein the circuitry includes a summation circuit coupled to the first through fourth Hall effect sensors.

12. The method of claim 1, wherein forming the magnetic concentrator includes: electroplating a metal layer on the surface of the semiconductor die.

13. The method of claim 12, wherein forming the magnetic concentrator includes: electroplating the metal layer on the surface of the semiconductor die before singulation.

14. The method of claim 1, wherein the isolation spacer includes at least one of: a glass dielectric material, a polymer-based dielectric material, or a silicon-based dielectric material.

15. The method of claim 1, further comprising: bonding the isolation spacer to the lead frame using an adhesive.

16. The method of claim 15, wherein the adhesive includes an epoxy adhesive.

17. The method of claim 15, wherein the surface is a first surface, and the isolation spacer is bonded to a second surface of the semiconductor die opposite to the first surface.

18. The method of claim 17, wherein the isolation spacer is bonded to the second surface of the semiconductor die after singulation.

19. The method of claim 1, wherein the electrical interconnects include bond wires.

20. The method of claim 1, further comprising encapsulating the lead frame, the isolation spacer, and the semiconductor die with an encapsulation compound.

* * * * *